(12) United States Patent
Chooi et al.

(10) Patent No.: US 6,436,824 B1
(45) Date of Patent: Aug. 20, 2002

(54) LOW DIELECTRIC CONSTANT MATERIALS FOR COPPER DAMASCENE

(75) Inventors: Simon Chooi; Mei Sheng Zhou; Yi Xu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/346,526

(22) Filed: Jul. 2, 1999

(51) Int. Cl.[7] .............................................. H01L 21/44
(52) U.S. Cl. .................. 438/687; 438/758; 438/769; 438/778; 438/780; 438/786; 438/790
(58) Field of Search .............................. 438/687, 786, 438/778, 758, 769, 780, 790

(56) References Cited

U.S. PATENT DOCUMENTS

| | | | |
|---|---|---|---|
| 5,523,163 A | 6/1996 | Ballance et al. | 428/446 |
| 5,605,867 A * | 2/1997 | Sato et al. | 438/790 |
| 5,648,200 A | 7/1997 | Letize et al. | 430/315 |
| 5,759,906 A | 6/1998 | Lou | 438/623 |
| 5,858,869 A | 1/1999 | Chen et al. | 438/597 |
| 5,880,018 A | 3/1999 | Boeck et al. | 438/619 |
| 6,159,871 A * | 12/2000 | Loboda et al. | 438/786 |

OTHER PUBLICATIONS

Chang et al., "ULSI Technology", The McGraw–Hill Companies Inc., New York, c. 1996, pp. 444–445.

* cited by examiner

Primary Examiner—David Nelms
Assistant Examiner—Reneé R. Berry
(74) Attorney, Agent, or Firm—George O. Saile; Rosemary L. S. Pike

(57) ABSTRACT

Novel low dielectric constant materials for use as dielectric in the dual damascene process are provided. A low dielectric constant material dielectric layer is formed by reacting a nitrogen-containing precursor and a substituted organosilane in a plasma-enhanced chemical deposition chamber. Also, novel low dielectric constant materials for use as a passivation or etch stop layer in the dual damascene process are provided. A carbon-doped silicon nitride passivation or etch stop layer having a low dielectric constraint is formed by reacting a substituted ammonia precursor and a substituted organosilane in a plasma-enhanced chemical deposition chamber. Alternatively, a silicon-carbide passivation or etch stop layer having a low dielectric constant is formed by reacting a substituted organosilane in a plasma-enhanced chemical deposition chamber. Also, an integrated process of forming passivation, dielectric, and etch stop layers for use in the dual damascene process is described.

28 Claims, 2 Drawing Sheets

US 6,436,824 B1

LOW DIELECTRIC CONSTANT MATERIALS FOR COPPER DAMASCENE

BACKGROUND OF THE INVENTION (1) Field of the Invention

The invention relates to a method of metallization in the fabrication of integrated circuits, and more particularly, to a method of dual damascene metallization in the manufacture of integrated circuits.

(2) Description of the Prior Art

The damascene or dual damascene process has become a future trend in integrated circuit manufacturing, especially in the copper metallization process. These processes are discussed in *ULSI Technology,* by Chang and Sze, The McGraw Hill Companies, Inc., NY, N.Y., c. 1996, pp. 444–445. In the copper damascene scheme, the conventional etch stop and passivation, or barrier, layers comprise silicon nitride which has a dielectric constant of about 7. One of the ways to reduce capacitance is to introduce an etch stop layer and a barrier layer having a low dielectric constant.

U.S. Pat. No. 5,858,869 to Chen et al discloses an intermetal dielectric layer using anisotropic plasma oxides and low dielectric constant polymers. U.S. Pat. No. 5,880,018 to Boeck et al shows a dual damascene process in which the top dielectric layer has a low dielectric constant. The layer comprises a spin-on-polymer or spin-on-glass or other low dielectric constant material such as HSQ. U.S. Pat. No. 5,648,200 to Letize et al discusses photoimageable dielectrics using organosilanes as conditioners. U.S. Pat. No. 5,759,906 to Lou shows a variety of conventional low dielectric constant materials. U.S. Pat. No. 5,523,163 to Ballance et al teaches the use of Si—O containing low dielectric constant materials.

SUMMARY OF THE INVENTION

A principal object of the present invention is to provide an effective and very manufacturable method of metallization in the fabrication of integrated circuit devices.

Another object of the invention is to provide a dual damascene metallization process using low dielectric constant materials.

Yet another object of the invention is to provide low dielectric constant materials for the dual damascene process.

Yet another object of the invention is to provide low dielectric constant materials as the passivation layer or etch stop layer in the dual damascene process.

In accordance with the objects of this invention novel low dielectric constant materials for use as dielectric in the dual damascene process are provided. A low dielectric constant material dielectric layer is formed by reacting a nitrogen-containing precursor and a substituted organosilane in a plasma-enhanced chemical deposition chamber.

Also, in accordance with the objects of the invention, novel low dielectric constant materials for use as a passivation or etch stop layer in the dual damascene process are provided. A carbon-doped silicon nitride passivation or etch stop layer having a low dielectric constant is formed by reacting a substituted ammonia precursor and a substituted organosilane in a plasma-enhanced chemical deposition chamber. Alternatively, a silicon-carbide passivation or etch stop layer having a low dielectric constant is formed by reacting a substituted organosilane in a plasma-enhanced chemical deposition chamber.

Also, in accordance with the objects of the invention, a process of forming passivation, dielectric, and etch stop layers for use in the dual damascene process is achieved. An interconnection line is provided through an insulating layer on a semiconductor substrate. A carbon-doped silicon nitride or silicon carbide passivation layer is deposited overlying the insulating layer and interconnection line. A first dielectric layer is deposited overlying the passivation layer wherein the first dielectric layer has a dielectric constant less than three. The first dielectric layer is cured. Thereafter, a carbon-doped silicon nitride or silicon carbide etch stop layer is deposited overlying the first dielectric layer. A second dielectric layer is deposited overlying the etch stop layer wherein the second dielectric layer has a dielectric constant less than three. The second dielectric layer is cured. An optional capping layer of carbon-doped silicon nitride or silicon carbide is deposited overlying the second dielectric layer. A dual damascene opening is formed through the second dielectric layer, the etch stop layer, the first dielectric layer, and the passivation layer to the interconnection line. A barrier metal layer and a copper layer are formed within the dual damascene opening to complete copper metallization in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention proposes a plasma-enhanced chemical vapor deposition (PECVD) of novel materials that have low dielectric constant properties such that they can be used by themselves as low dielectric constant material or incorporated into the passivation layer or the etch stop layer to reduce the dielectric constant. These materials are especially useful in the copper damascene process.

Figure 1:
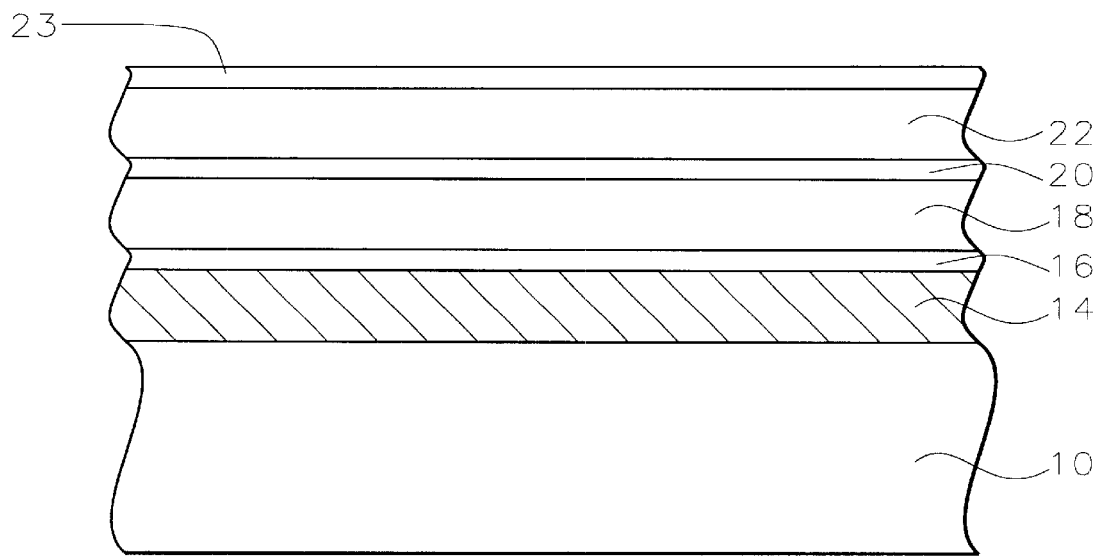
FIGS. 1 and 2 schematically illustrate in cross-sectional representation a dual damascene process of the present invention.

Referring now more particularly to FIG. 1, there is illustrated a portion of a partially completed integrated circuit device. There is shown a semiconductor substrate 10, preferably composed of monocrystalline silicon. Semiconductor devices structures, such as gate electrodes, source and drain regions, and metal interconnects, not shown, are formed in and on the semiconductor substrate and covered with an insulating layer. Interconnection lines, such as copper or aluminum-copper line 14, for example, is formed over the insulating layer and will contact some of the underlying semiconductor device structures through openings in the insulating layer, not shown.

Now, a passivation or barrier layer 16 is formed over the copper line to a thickness of between about 200 and 5000 Angstroms. A first dielectric layer 18 is deposited over the barrier layer 16 to a thickness of between about 1000 and 10,000 Angstroms. Next, an etch stop layer 20 is deposited to a thickness of between about 200 and 5000 Angstroms followed by a second dielectric layer 22 having a thickness of between about 1000 and 10,000 Angstroms. An optional capping layer 23 can be deposited over the second dielectric layer to a thickness of between about 200 and 5000 Angstroms.

Figure 2:
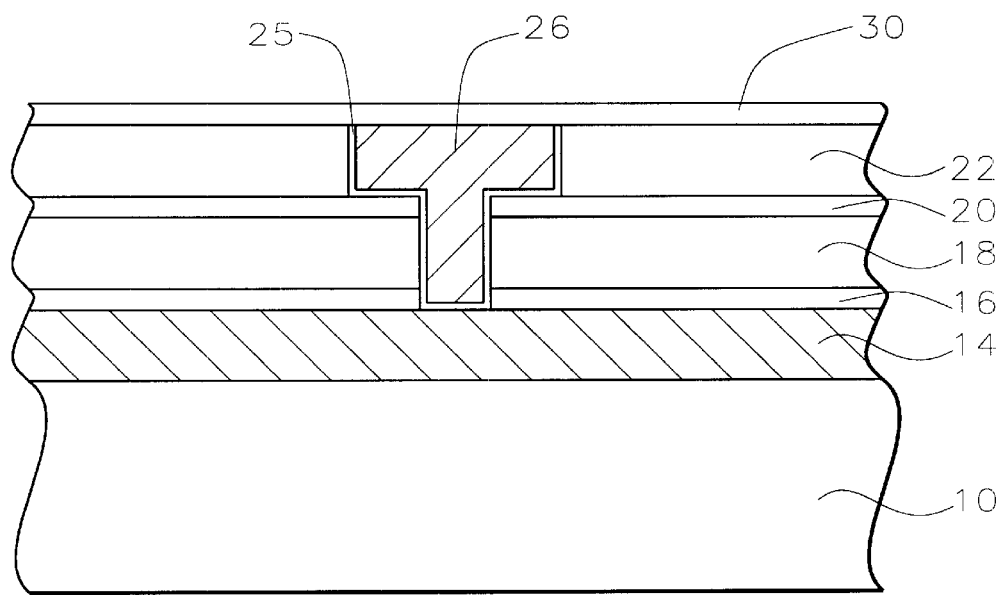

In the conventional dual damascene process, a dual damascene opening is etched through the first and second dielectric layers, the etch stop layer and the passivation layer, using one of the various schemes such as trench-first, via-first, or embedded via. The dual damascene opening is then filled with a barrier metal layer 25 and a copper layer 26, as shown in FIG. 2, by any of the conventional means, including physical or chemical vapor deposition and etchback or polishing or electroless plating, and so on. A final passivation layer 30 completes the metallization process.

Now, the novel dielectric materials of the present invention will be described. To function as a barrier layer (such as passivation layer 16), the silicon based material should not contain Si—O bonds since copper is known to diffuse into silicon dioxide. The inventors propose a novel dielectric material having a low dielectric constant that can be used for the passivation layer or for the etch stop layer or for the optional capping layer. The novel dielectric material can be used for either the passivation or etch stop layers and preferably for both. This material may be used for the optional capping layer and should be used for the final passivation layer 30.

In a first preferred embodiment of the present invention, a carbon-doped silicon nitride film is proposed. The carbon-doped silicon nitride film can be deposited by PECVD from a combination of substituted ammonia precursors and substituted organosilanes. This results in a film having a low dielectric constant of probably between about 3 and 6. One or more of the substituted ammonia precursors may be combined with one or more of the substituted organosilanes.

The substituted ammonia precursors include: $NH_3$ (ammonia), $H_2N—NH_2$ (hydrazine), $H_2N—NHCH_3$ (methylhydrazine), $H_2C=NNH_2$ (hydrazone), and $H_2C=NNHCH_3$ (methylhydrazone).

The substituted organosilanes are all liquids and include the following groups:

i) $RSiH_3$ where $R=CH_3$ (methylsilane), $C_2H_5$ (ethylsilane), $C_3H_7$ (propylsilane), $(CH_3)_2CH_2$ (isopropylsilane), $C_4H_9$ (butylsilane), $C_6H_5$ (phenylsilane), $C_5H_{11}$ (pentylsilane), $C_6H_5CH_2$ (benzylsilane);

ii) $(R)_2SiH_2$ where $R=CH_3$ (dimethylsilane), $C_2H_5$ (diethylsilane), $C_3H_7$ (dipropylsilane), $(CH_3)_2CH_2$ (diisopropylsilane);

iii) $(R)_3SiH$ where $R=CH_3$ (trimethylsilane), $C_2H_5$ (triethylsilane), $C_3H_7$ (tripropylsilane), $(CH_3)_2CH_2$ (triisopropylsilane);

iv) $(R)_4Si$ where $R=CH_3$ (tetramethylsilane), $C_2H_5$ (tetraethylsilane), $H_2C=CH$ (tetravinylsilane), $H_2C=CHCH_2$ (tetraallylsilane);

v) $RSiH(CH_3)_2$ where $R=C_2H_5$ (dimethylethylsilane), $C_3H_7$ (dimethylpropylsilane), $(CH_3)_2CH$ (dimethylisopropylsilane), $(CH_3)_3C$ (t-butyldimethylsilane), $C_6H_5$ (dimethylphenylsilane), $C_6H_{11}$ (cyclohexyldimethylsilane);

vi) $RSiH(C_2H_5)_2$ where $R=CH_3$ (diethylmethylsilane);

vii) $RSi(CH_3)_3$ where $R=C_2H_5$ (trimethylethylsilane), $C_3H_7$ (trimethylpropylsilane), $(CH_3)_2CH_2$ (trimethylisopropylsilane), $C_6H_5$ (phenyltrimethylsilane), $C_6H_5CH_2$ (benzyltrimethylsilane), $H_2C=CH$ (trimethylvinylsilane), $H_2C=CHCH_2$ (allyltrimethylsilane), $HC\equiv C$ ((trimethylsilyl)acetylene), $HC\equiv CCH_2$ (propargyltrimethylsilane), $CH_3(CH_2)_3C\equiv C$ ((trimethylsilyl)-1-hexyne), $CH_3(CH_2)_3C\equiv C$ ((trimethylsilyl)-1-pentyne);

viii) $RSi(CH_3)_2$ where $R=C_2H_5$ (dimethyldiethylsilane), $C_3H_7$ (dimethyldipropylsilane), $(CH_3)_2CH_2$ (dimethyldiisopropylsilane), $H_2C=CHCH_2$ (diallyldimethylsilane).

The substituted organosilanes may be from one or more of the groups i–viii.

During the reaction to form the carbon-doped silicon nitride film, gases flowing into the PECVD chamber may include one of more of: nitrogen, hydrogen, helium, and argon. These gases act as carrier or diluent gases, although nitrogen and hydrogen may be involved in the reaction. Flow rates are typically from 50 to 10,000 sccm.

Alternatively, in a second preferred embodiment of the present invention, a silicon-carbide type material may be formed by PECVD of only the substituted organosilanes (without the substituted ammonia precursors). In this case, the resulting film has a dielectric constant of between about 3 to 6.5. This film is also used as the passivation or etch stop layer or the optional capping layer. One or more than one substituted organosilane may be used, but one is preferable.

In a third preferred embodiment of the present invention, the novel low dielectric constant material of the invention can be used for the dielectric layers 18 and 22. For the application as a low dielectric constant material compatible with copper, the same set of substituted organosilanes detailed above can be used in combination with one of the following nitrogen-containing precursors: NO (nitric oxide), $N_2O$ (nitrous oxide), $N_2O_4$ (nitrogen dioxide), and $N_2O/NF_3$ in a PECVD reaction. The dielectric constant of the resulting film will be less than 3. One or more than one substituted organosilane may be used, but one is preferable.

Figure 3:
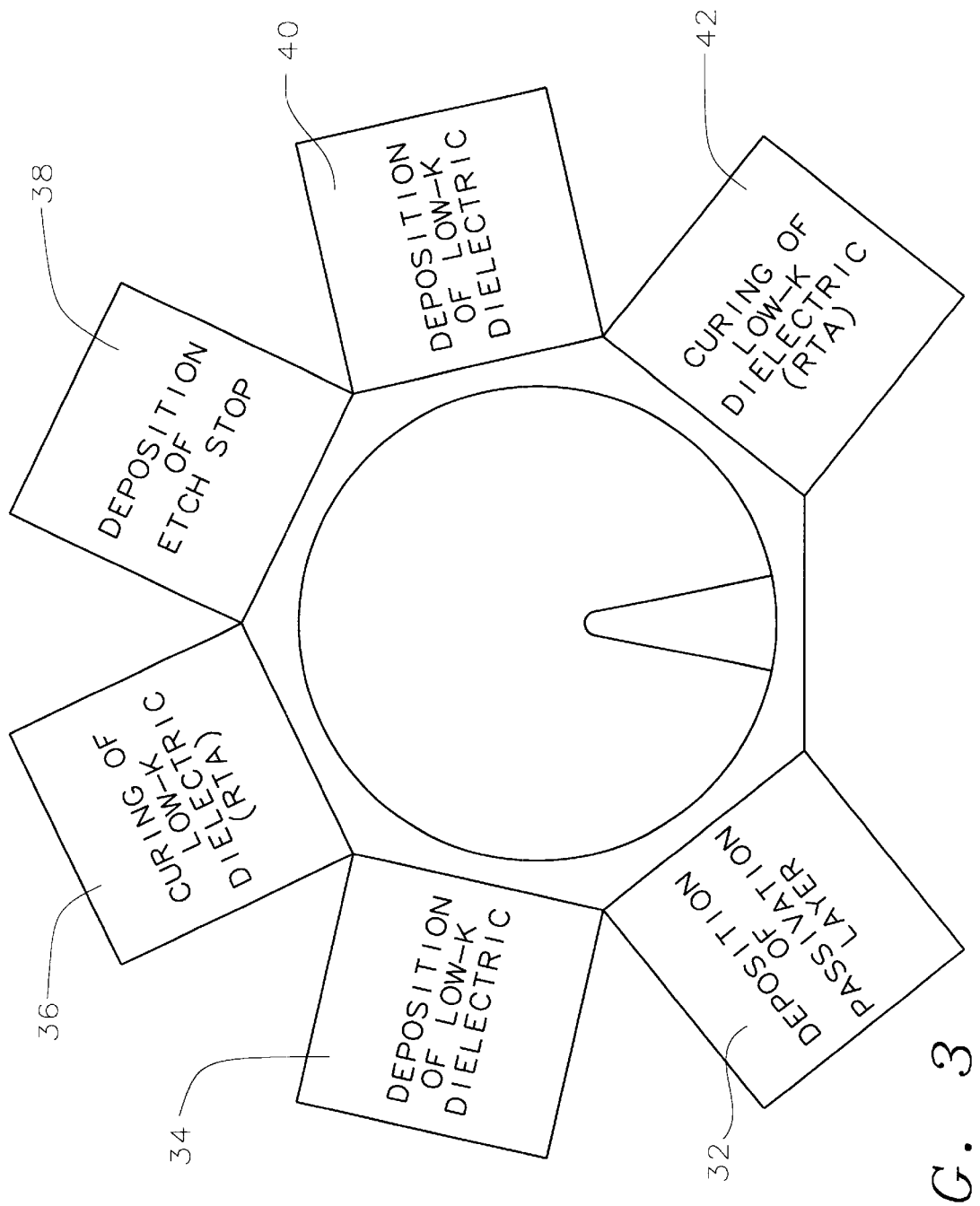
FIG. 3 schematically illustrates the PECVD equipment usage of the present invention.

The invention further proposes an integrated approach to using the novel low dielectric constant materials detailed above. The integrated approach involves the use of the same equipment for forming the passivation, dielectric, and etch stop layers. The equipment 30 is illustrated in FIG. 3.

In the integrated approach, referring to FIG. 1, passivation layer 16 is deposited by one of the PECVD methods described in the first and second embodiments. Chamber 32 in FIG. 3 is used for this deposition. Next, the first dielectric layer 18 is deposited 34 using the same equipment either in the same chamber or in a different chamber. This first dielectric layer comprises the novel low dielectric constant material described in the third embodiment of the invention. Next, the wafer is moved to another chamber 36 where the first dielectric layer 18 is cured to remove $H_2O$ and to densify the dielectric material. This curing is by rapid thermal annealing (RTA) under the following conditions: temperature 100–500° C., duration 10–300 seconds, ramp rate: 10–100° C. per second, gas: $N_2$, Ar, $N_2/H_2$, gas flow: 500–10,000 sccm. Next, the etch stop layer 20 is deposited 38 using the method described in the first or second embodiment of the invention.

The second dielectric layer 22 is deposited 40 The second dielectric layer comprises the novel low dielectric constant material described in the third embodimnent of the invention. The wafer is moved to chamber 42 where the second dielectric layer 22 is cured to remove $H_2O$ and to densify the dielectric material, as detailed above for the first dielectric layer.

The novel low dielectric constant materials of the present invention can be used for the passivation layer, etch stop layer, and dielectric layers in the dual damascene metallization process. The passivation and etch stop layers and the optional capping layer of the present invention are formed by PECVD of substituted ammonia precursors and substituted organosilanes to form a carbon-doped silicon nitride film having a dielectric constant of about 3 to 6. Alternatively, a silicon-carbide film may be formed using only the substituted organosilanes resulting in a film with a dielectric constant of about 3 to 6.5. Both of these materials do not incorporate silicon dioxide and so are good barriers to copper diffusion. The dielectric layer of the present invention is formed by reacting the substituted organosilane precursors with nitrogen-containing precursors to obtain a film having a dielectric constant of less than 3. This material has a very low dielectric constant which is preferred for the dielectric layer.

The process of the present invention also provides an integrated approach to using the novel low dielectric constant materials in the dual damascene process.

While the invention has been particularly shown and described with reference to the preferred embodiments thereof, it will be understood by those skilled in the art that various changes in form and details may be made without departing from the spirit and scope of the invention.

What is claimed is:

1. A method of forming a dielectric material layer comprising:
   reacting one or more substituted ammonia precursors and one or more substituted organosilanes in a plasma-enhanced chemical deposition chamber to form said dielectric material.

2. The method according to claim 1 further comprising flowing one or more of the gases in the group containing: nitrogen, hydrogen, helium, and argon during said reacting step.

3. The method according to claim 1 wherein said substituted ammonia precursors are chosen from the group containing: $NH_3$ (ammonia), $H_2N-NH_2$ (hydrazine), $H_2N-NHCH_3$ (methylhydrazine), $H_2C=NNH_2$ (hydrazone), and $H_2C=NNHCH_3$ (methylhydrazine).

4. The method according to claim 1 wherein said substituted organosilanes are chosen from the group containing:
   i) $RSiH_3$ where $R=CH_3$ (methylsilane), $C_2H_5$ (ethylsilane), $C_3H_7$ (propylsilane), $(CH_3)_2CH$ (isopropylsilane), $C_4H_9$ (butylsilane), $C_6H_5$ (phenylsilane), $C_5H_{11}$ (pentylsilane), or $C_6H_5CH_2$ (benzylsilane),
   ii) $(R)_2SiH_2$ where $R=CH_3$ (dimethylsilane), $C_2H_5$ (diethylsilane), $C_3H_7$ (dipropylsilane), or $(CH_3)_2CH$ (diisopropylsilane),
   iii) $(R)_3SiH$ where $R=CH_3$ (trimethylsilane), $C_2H_5$ (triethylsilane), $C_3H_7$ (tripropylsilane), or $(CH_3)_2CH$ (triisopropylsilane),
   iv) $(R)_4Si$ where $R=CH_3$ (tetramethylsilane), $C_2H_5$ (tetraethylsilane), $H_2C=CH$ (tetravinylsilane), or $H_2C=CHCH_2$ (tetraallylsilane),
   v) $RSiH(CH_3)_2$ where $R=C_2H_5$ (dimethylethylsilane), $C_3H_7$ (dimethylpropylsilane), $(CH_3)_2CH$ (dimethylisopropylsilane), $(CH_3)_3C$ (t-butyldimethylsilane), $C_6H_5$ (dimethylphenylsilane), or $C_6H_{11}$ (cyclohexyldimethylsilane),
   vi) $RSiH(C_2H_5)_2$ where $R=CH_3$ (diethylmethylsilane),
   vii) $RSi(CH_3)_3$ where $R=C_2H_5$ (trimethylethylsilane), $C_3H_7$ (trimethylpropylsilane), $(CH_3)_2CH_2$ (trimethylisopropylsilane), $C_6H_5$ (phenyltrimethylsilane), $C_6H_5CH_2$ (benzyltrimethylsilane), $H_2C=CH$ (trimethylvinylsilane), $H_2C=CHCH_2$ (allyltrimethylsilane), $HC\equiv C$ ((trimethylsilyl)acetylene), $HC\equiv CCH_2$ (propargyltrimethylsilane), $CH_3(CH_2)_3C\equiv C$ ((trimethylsilyl)-1-hexyne), or $CH_3(CH_2)_3C\equiv C$ ((trimethylsilyl)-1-pentyne), and
   viii) $RSi(CH_3)_2$ where $R=C_2H_5$ (dimethyldiethylsilane), $C_3H_7$ (dimethyldipropylsilane), $(CH_3)_2CH_2$ (dimethyldiisopropylsilane), or $H_2C=CHCH_2$ (diallyldimethylsilane).

5. The method according to claim 1 wherein said dielectric material has a dielectric constant of between 3 and 6.

6. A method of forming a carbon-doped silicon nitride dielectric material layer comprising:
   reacting one or more substituted ammonia precursors and one or more substituted organosilanes in a plasma-enhanced chemical deposition chamber to form said carbon-doped silicon nitride dielectric material.

7. The method according to claim 6 further comprising flowing one or more of the gases in the group containing: nitrogen, hydrogen, helium, and argon during said reacting step.

8. The method according to claim 6 wherein said substituted ammonia precursors are chosen from the group containing: $NH_3$ (ammonia), $H_2N-NH_2$ (hydrazine), $H_2N-NHCH_3$ (methylhydrazine), $H_2C=NNH_2$ (hydrazone), and $H_2C=NNHCH_3$ (methylhydrazine).

9. The method according to claim 6 wherein said substituted organosilanes are chosen from the group containing:
   i) $RSiH_3$ where $R=CH_3$ (methylsilane), $C_2H_5$ (ethylsilane), $C_3H_7$ (propylsilane), $(CH_3)_2CH$ (isopropylsilane), $C_4H_9$ (butylsilane), $C_6H_5$ (phenylsilane), $C_5H_{11}$ (pentylsilane), or $C_6H_5CH_2$ (benzylsilane),
   ii) $(R)_2SiH_2$ where $R=CH_3$ (dimethylsilane), $C_2H_5$ (diethylsilane), $C_3H_7$ (dipropylsilane), or $(CH_3)_2CH$ (diisopropylsilane),
   iii) $(R)_3SiH$ where $R=CH_3$ (trimethylsilane), $C_2H_5$ (triethylsilane), $C_3H_7$ (tripropylsilane), or $(CH_3)_2CH$ (triisopropylsilane),
   iv) $(R)_4Si$ where $R=CH_3$ (tetramethylsilane), $C_2H_5$ (tetraethylsilane), $H_2C=CH$ (tetravinylsilane), or $H_2C=CHCH_2$ (tetraallylsilane),
   v) $RSiH(CH_3)_2$ where $R=C_2H_5$ (dimethylethylsilane), $C_3H_7$ (dimethylpropylsilane), $(CH_3)_2CH$ (dimethylisopropylsilane), $(CH_3)_3C$ (t-butyldimethylsilane), $C_6H_5$ (dimethylphenylsilane), or $C_6H_{11}$ (cyclohexyldimethylsilane),
   vi) $RSiH(C_2H_5)_2$ where $R=CH_3$ (diethylmethylsilane),
   vii) $RSi(CH_3)_3$ where $R=C_2H_5$ (trimethylethylsilane), $C_3H_7$ (trimethylpropylsilane), $(CH_3)_2CH_2$ (trimethylisopropylsilane), $C_6H_5$ (phenyltrimethylsilane), $C_6H_5CH_2$ (benzyltrimethylsilane), $H_2C=CH$ (trimethylvinylsilane), $H_2C=CHCH_2$ (allyltrimethylsilane), $HC\equiv C$ ((trimethylsilyl)acetylene), $HC\equiv CCH_2$ (propargyltrimethylsilane), $CH_3(CH_2)_3C\equiv C$ ((trimethylsilyl)-1-hexyne), or $CH_3(CH_2)_3C\equiv C$ ((trimethylsilyl)-1-pentyne), and
   viii) $RSi(CH_3)_2$ where $R=C_2H_5$ (dimethyldiethylsilane), $C_3H_7$ (dimethyldipropylsilane), $(CH_3)_2CH_2$ (dimethyldiisopropylsilane), or $H_2C=CHCH_2$ (diallyldimethylsilane).

10. The method according to claim 6 wherein said carbon-doped silicon nitride dielectric material has a dielectric constant of between 3 and 6.

11. A method of forming a silicon-carbide dielectric material layer comprising:
    reacting one or more substituted organosilanes in a plasma-enhanced chemical deposition chamber to form said silicon-carbide dielectric material.

12. The method according to claim 11 further comprising flowing one or more of the gases in the group containing: nitrogen, hydrogen, helium, and argon during said reacting step.

13. The method according to claim 11 wherein said substituted organosilanes are chosen from the group containing:
   i) $RSiH_3$ where $R=CH_3$ (methylsilane), $C_2H_5$ (ethylsilane), $C_3H_7$ (propylsilane), $(CH_3)_2CH_2$ (isopropylsilane), $C_4H_9$ (butylsilane), $C_6H_5$ (phenylsilane), $C_5H_{11}$ (pentylsilane), or $C_6H_5CH_2$ (benzylsilane),
   ii) $(R)_2SiH_2$ where $R=CH_3$ (dimethylsilane), $C_2H_5$ (diethylsilane), $C_3H_7$ (dipropylsilane), or $(CH_3)_2CH_2$ (diisopropylsilane),
   iii) $(R)_3SiH$ where $R=CH_3$ (trimethylsilane), $C_2H_5$ (triethylsilane), $C_3H_7$ (tripropylsilane), or $(CH_3)_2CH_2$ (triisopropylsilane),
   iv) $(R)_4Si$ where $R=CH_3$ (tetramethylsilane), $C_2H_5$ (tetraethylsilane), $H_2C=CH$ (tetravinylsilane), or $H_2C=CHCH_2$ (tetraallylsilane),
   v) $RSiH(CH_3)_2$ where $R=C_2H_5$ (dimethylethylsilane), $C_3H_7$ (dimethylpropylsilane), $(CH_3)_2CH$ (dimethylisopropylsilane), $(CH_3)_3C$ (t-butyldimethylsilane), $C_6H_5$ (dimethylphenylsilane), or $C_6H_{11}$ (cyclohexyldimethylsilane),
   vi) $RSiH(C_2H_5)_2$ where $R=CH_3$ (diethylmethylsilane),
   vii) $RSi(CH_3)_3$ where $R=C_2H_5$ (trimethylethylsilane), $C_3H_7$ (trimethylpropylsilane), $(CH_3)_2CH_2$ (trimethylisopropylsilane), $C_6H_5$ (phenyltrimethylsilane), $C_6H_5CH_2$ (benzyltrimethylsilane), $H_2C=CH$ (trimethylvinylsilane), $H_2C=CHCH_2$ (allyltrimethylsilane), $HC\equiv C$ ((trimethylsilyl) acetylene), $HC\equiv CCH_2$ (propargyltrimethylsilane), $CH_3(CH_2)_3C\equiv C$ ((trimethylsilyl)-1-hexyne), or $CH_3(CH_2)_3C\equiv C$ ((trimethylsilyl)-1-pentyne), and
   viii) $RSi(CH_3)_2$ where $R=C_2H_5$ (dimethyldiethylsilane), $C_3H_7$ (dimethyldipropylsilane), $(CH_3)_2CH_2$ (dimethyldiisopropylsilane), or $H_2C=CHCH_2$ (diallyldimethylsilane).

14. The method according to claim 11 wherein said silicon-carbide dielectric material has a dielectric constant of between 3 and 6.5.

15. A method of forming a dielectric material comprising:
   reacting a nitrogen-containing precursor and one or more substituted organosilanes in a plasma-enhanced chemical deposition chamber to form said dielectric material.

16. The method according to claim 15 wherein said nitrogen-containing precursor is chosen from the group containing: NO (nitric oxide), $N_2O$ (nitrous oxide), $N_2O_4$ (nitrogen dioxide), and $N_2O/NF_3$.

17. The method according to claim 15 wherein said substituted organosilanes are chosen from the group containing:
   i) $RSiH_3$ where $R=CH_3$ (methylsilane), $C_2H_5$ (ethylsilane), $C_3H_7$ (propylsilane), $(CH_3)_2CH_2$ (isopropylsilane), $C_4H_9$ (butylsilane), $C_6H_5$ (phenylsilane), $C_5H_{11}$ (pentylsilane), or $C_6H_5CH_2$ (benzylsilane),
   ii) $(R)_2SiH_2$ where $R=CH_3$ (dimethylsilane), $C_2H_5$ (diethylsilane), $C_3H_7$ (dipropylsilane), or $(CH_3)_2CH_2$ (diisopropylsilane),
   iii) $(R)_3SiH$ where $R=CH_3$ (trimethylsilane), $C_2H_5$ (triethylsilane), $C_3H_7$ (tripropylsilane), or $(CH_3)_2CH_2$ (triisopropylsilane),
   iv) $(R)_4Si$ where $R=CH_3$ (tetramethylsilane), $C_2H_5$ (tetraethylsilane), $H_2C=CH$ (tetravinylsilane), or $H_2C=CHCH_2$ (tetraallylsilane),
   v) $RSiH(CH_3)_2$ where $R=C_2H_5$ (dimethylethylsilane), $C_3H_7$ (dimethylpropylsilane), $(CH_3)_2CH$ (dimethylisopropylsilane), $(CH_3)_3C$ (t-butyldimethylsilane), $C_6H_5$ (dimethylphenylsilane), or $C_6H_{11}$ (cyclohexyldimethylsilane),
   vi) $RSiH(C_2H_5)_2$ where $R=CH_3$ (diethylmethylsilane),
   vii) $RSi(CH_3)_3$ where $R=C_2H_5$ (trimethylethylsilane), $C_3H_7$ (trimethylpropylsilane), $(CH_3)_2CH_2$ (trimethylisopropylsilane), $C_6H_5$ (phenyltrimethylsilane), $C_6H_5CH_2$ (benzyltrimethylsilane), $H_2C=CH$ (trimethylvinylsilane), $H_2C=CHCH_2$ (allyltrimethylsilane), $HC\equiv C$ ((trimethylsilyl) acetylene), $HC\equiv CCH_2$ (propargyltrimethylsilane), $CH_3(CH_2)_3C\equiv C$ ((trimethylsilyl)-1-hexyne), or $CH_3(CH_2)_3C\equiv C$ ((trimethylsilyl)-1-pentyne), and
   viii) $RSi(CH_3)_2$ where $R=C_2H_5$ (dimethyldiethylsilane), $C_3H_7$ (dimethyldipropylsilane), $(CH_3)_2CH_2$ (dimethyldiisopropylsilane), or $H_2C=CHCH_2$ (diallyldimethylsilane).

18. The method according to claim 15 wherein said dielectric material has a dielectric constant of less than 3.

19. A method of forming a dielectric material layer having no silicon-oxygen bonds comprising:
   reacting one or more substituted ammonia precursors and one or more substituted organosilanes in a plasma-enhanced chemical deposition chamber to form said dielectric material layer having no silicon-oxygen bonds.

20. The method according to claim 19 further comprising flowing one or more of the gases in the group containing: nitrogen, hydrogen, helium, and argon during said reacting step.

21. The method according to claim 19 wherein said substituted ammonia precursors are chosen from the group containing:
   $NH_3$ (ammonia), $H_2N-NH_2$ (hydrazine), $H_2N-NHCH_3$ (methylhydrazine), $H_2C=NNH_2$ (hydrazone), and $H_2C=NNHCH_3$ (methylhydrazine).

22. The method according to claim 19 wherein said substituted organosilanes are chosen from the group containing:
   i) $RSiH_3$ where $R=CH_3$ (methylsilane), $C_2H_5$ (ethylsilane), $C_3H_7$ (propylsilane), $(CH_3)_2CH_2$ (isopropylsilane), $C_4H_9$ (butylsilane), $C_6H_5$ (phenylsilane), $C_5H_{11}$ (pentylsilane), or $C_6H_5CH_2$ (benzylsilane),
   ii) $(R)_2SiH_2$ where $R=CH_3$ (dimethylsilane), $C_2H_5$ (diethylsilane), $C_3H_7$ (dipropylsilane), or $(CH_3)_2CH_2$ (diisopropylsilane),
   iii) $(R)_3SiH$ where $R=CH_3$ (trimethylsilane), $C_2H_5$ (triethylsilane), $C_3H_7$ (tripropylsilane), or $(CH_3)_2CH_2$ (triisopropylsilane),
   iv) $(R)_4Si$ where $R=CH_3$ (tetramethylsilane), $C_2H_5$ (tetraethylsilane), $H_2C=CH$ (tetravinylsilane), or $H_2C=CHCH_2$ (tetraallylsilane),
   v) $RSiH(CH_3)_2$ where $R=C_2H_5$ (dimethylethylsilane), $C_3H_7$ (dimethylpropylsilane), $(CH_3)_2CH$ (dimethylisopropylsilane), $(CH_3)_3C$ (t-butyldimethylsilane), $C_6H_5$ (dimethylphenylsilane), or $C_6H_{11}$ (cyclohexyldimethylsilane),
   vi) $RSiH(C_2H_5)_2$ where $R=CH_3$ (diethylmethylsilane),
   vii) $RSi(CH_3)_3$ where $R=C_2H_5$ (trimethylethylsilane), $C_3H_7$ (trimethylpropylilane), $(CH_3)_2CH_2$ (trimethylisopropylsilane), $C_6H_5$ (phenyltrimethylsilane), $C_6H_5CH_2$ (benzyltrimethylsilane), $H_2C=CH$ (trimethylvinylsilane), $H_2C=CHCH_2$ (allyltrimethylsilane), $HC\equiv C$ (trimethylsilyl) acetylene), $HC\equiv CCH_2$ (propargyltrimethylsilane), $CH_3(CH_2)_3C\equiv C$ ((trimethylsilyl)-1-hexyne), or $CH_3(CH_2)_3C\equiv C$ ((trimethylsilyl)-1-pentyne), and viii) $RSi(CH_3)_2$ where $R=C_2H_5$ (dimethyldiethylsilane), $C_3H_7$ (drimethyldipropylsilane), $(CH_3)_2CH_2$ (dimethyldiisopropylsilane), or $H_2C=CHCH_2$ (diallyldimethylsilane).

23. The method according to claim 19 wherein said dielectric material has a dielectric constant of between 3 and 6.

24. The method according to claim 19 wherein said dielectric material comprises carbon-doped silicon nitride.

25. A method of forming a silicon-carbide dielectric material layer having no Silicon-oxygen bonds comprising:

reacting one or more substituted organosilanes in a plasma-ehanced chemical deposition chamber to form said silicon-carbide dielectric material having no silicon-oxygen bonds.

26. The method according to claim 25 further comprising flowing one or more of the gases in the group containing: nitrogen, hydrogen, helium, and argon during said reacting step.

27. The method according to claim 25 wherein said substituted organosilanes are chosen from the group containing:

i) $RSiH_3$ where $R=CH_3$ (methylsilane), $C_2H_5$ (ethylsilane), $C_3H_7$ (propylsilane), $(CH_3)_2CH_2$ (isopropylsilane), $C_4H_9$ (butylsilane), $C_6H_5$ (phenylsilane), $C_5H_{11}$ (pentylsilane), or $C_6H_5CH_2$ (benzylsilane), ii) $(R)_2SiH_2$ where $R=CH_3$ (dimethylsilane), $C_2H_5$ (diethylsilane), $C_3H_7$ (dipropylsilane), or $(CH_3)_2CH_2$ (diisopropylsilane), iii) $(R)_3SiH$ where $R=CH_3$ (trimethylsilane), $C_2H_5$ (triethylsilane), $C_3H_7$ (tripropylsilane), or $(CH_3)_2CH_2$ (triisopropylsilane), iv) $(R)_4Si$ where $R=CH_3$ (tetramethylsilane), $C_2H_5$ (tetraethylsilane), $H_2C=CH$ (tetravinylsilane), or $H_2C=CHCH_2$ (tetraallylsilane), v) $RSiH(CH_3)_2$ where $R=C_2H_5$ (dimethylethylsilane), $C_3H_7$ (dimethylpropylsilane), $(CH_3)_2CH$ (dimethylisopropylsilane), $(CH_3)_3C$ (t-butyldimethylsilane), $C_6H_5$ (dimethylphenylsilane), or $C_6H_{11}$ (cyclohexyldimethylsilane), vi) $RSiH(C_2H_5)_2$ where $R=CH_3$ (diethylmethylsilane), vii) $RSi(CH_3)_3$ where $R=C_2H_5$ (trimethylethylsilane), $C_3H_7$ (trimethylpropylsilane), $(CH_3)_2CH_2$ (trimethylisopropylsilane), $C_6H_5$ (phenyltrimethylsilane), $C_6H_5CH_2$ (benzyltrimethylsilane), $H_2C=CH$ (trimethylvinylsilane), $H_2C=CHCH_2$ (allyltrimethylsilane), $HC\equiv C$ ((trimethylsilyl) acetylene), $HC\equiv CCH_2$ (propargyltrimethylsilane), $CH_3(CH_2)_3C\equiv C$ ((trimethylsilyl)-1-hexyne), or $CH_3(CH_2)_3C\equiv C$ ((trimethylsilyl)-1-pentyne), and viii) $RSi(CH_3)_2$ where $R=C_2H_5$ (dimethyldiethyl1ilane), $C_3H_7$ (dimethyldipropylsilane), $(CH_3)_2CH_2$ (dimethyldiisopropylsilane), or $H_2C=CHCH_2$ (diallyldimethylsilane).

28. The method according to claim 25 wherein said silicon-carbide dielectric material has a dielectric constant of between 3 and 6.5.

* * * * *